United States Patent
Koo et al.

(10) Patent No.: US 7,453,059 B2
(45) Date of Patent: *Nov. 18, 2008

(54) TECHNIQUE FOR MONITORING AND CONTROLLING A PLASMA PROCESS

(75) Inventors: Bon-Woong Koo, Andover, MA (US); Ziwei Fang, Beverly, MA (US); Ludovic Godet, North Reading, MA (US); Vikram Singh, North Andover, MA (US); Vassilis Panayotis Vourloumis, Peabody, MA (US); Bernard G. Lindsay, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/678,524

(22) Filed: Feb. 23, 2007

(65) Prior Publication Data

US 2007/0227231 A1    Oct. 4, 2007

Related U.S. Application Data

(63) Continuation-in-part of application No. 11/371,907, filed on Mar. 10, 2006.

(51) Int. Cl.
G01N 27/26 (2006.01)
G01N 33/00 (2006.01)
H01J 49/40 (2006.01)

(52) U.S. Cl. .......... 250/287; 250/286; 250/423 R; 250/492.2; 315/111.31; 315/111.81

(58) Field of Classification Search ......... 250/286–288, 250/292, 299, 281–283, 305, 306, 423 R, 250/492.2, 492.21; 315/111.01, 111.21, 315/111.31, 111.81

See application file for complete search history.

(56) References Cited

U.S. PATENT DOCUMENTS 3,911,314 A * 10/1975 Schulz et al. ............ 313/361.1

(Continued)

FOREIGN PATENT DOCUMENTS

WO         9856029 A    12/1998
WO     20040051850 A     6/2004

OTHER PUBLICATIONS

Pollard, J.E., et al.; "Time-Resolved Mass and Energy Analysis by Position-Sensitive Time-Of-Flight Detection"; Review of Scientific Instruments, AIP, Melville, NY, vol. 60, No. 10; Oct. 1, 1989, pp. 3171-3180.

(Continued)

Primary Examiner—Bernard E Souw

(57)     ABSTRACT

A time-of-flight ion sensor for monitoring ion species in a plasma includes a housing. A drift tube is positioned in the housing. An extractor electrode is positioned in the housing at a first end of the drift tube so as to attract ions from the plasma. A plurality of electrodes is positioned at a first end of the drift tube proximate to the extractor electrode. The plurality of electrodes is biased so as to cause at least a portion of the attracted ions to enter the drift tube and to drift towards a second end of the drift tube. An ion detector is positioned proximate to the second end of the drift tube. The ion detector detects arrival times associated with the at least the portion of the attracted ions.

31 Claims, 14 Drawing Sheets

U.S. PATENT DOCUMENTS

| | | | |
|---|---|---|---|
| 4,362,936 | A | 12/1982 | Hofmann et al. |
| 5,218,204 | A | 6/1993 | Houk et al. |
| 5,614,711 | A * | 3/1997 | Li et al. .................. 250/287 |
| 5,650,616 | A | 7/1997 | Iketaki |
| 5,654,543 | A | 8/1997 | Li |
| 5,784,424 | A | 7/1998 | Fries et al. |
| 5,872,824 | A | 2/1999 | Fries et al. |
| 6,101,971 | A * | 8/2000 | Denholm et al. ......... 118/723 E |
| 6,137,112 | A | 10/2000 | McIntyre et al. |
| 6,222,186 | B1 | 4/2001 | Li et al. |
| 6,242,735 | B1 | 6/2001 | Li et al. |
| 6,373,052 | B1 | 4/2002 | Hoyes et al. |
| 6,956,205 | B2 * | 10/2005 | Park .................. 250/288 |
| 6,987,264 | B1 | 1/2006 | Whitehouse et al. |
| 7,119,330 | B2 | 10/2006 | Kalinitchenko |
| 2003/0098413 | A1 * | 5/2003 | Weinberger et al. ......... 250/288 |
| 2004/0211897 | A1 * | 10/2004 | Kim et al. .................. 250/288 |
| 2005/0230614 | A1 * | 10/2005 | Glukhoy .................. 250/287 |
| 2007/0170994 | A1 * | 7/2007 | Peggs et al. .................. 331/34 |
| 2007/0210248 | A1 * | 9/2007 | Koo et al. .................. 250/287 |
| 2007/0227231 | A1 * | 10/2007 | Koo et al. .................. 73/31.05 |
| 2007/0278397 | A1 * | 12/2007 | Bateman et al. ............. 250/286 |
| 2008/0026133 | A1 | 1/2008 | Fang et al. |

OTHER PUBLICATIONS

Jahn, P.W., et al.; "Combined Instrument for the On-Line Investigation of Plasma Deposited or Etched Surfaces by Monochromatized X-Ray Photoelectronspectroscopy and Time-Of-Flight Secondary Ion Mass Spectrometry;" Journal of Vacuum Science and Technology: Part A, AVS/AIP, Melville, NY, vol. 12, No. 3, May 1, 1994, pp. 671-676.

Gou, F., et al.; "A New Time-of-Flight Instrument Capable of In Situ and Real-Time Studies of Plasma-Treated Surfaces," Vacuum, vol. 81, 2006, pp. 196-201.

Brown, I.G., et al., Improved Time-Of-Flight Ion Charge State Diagnostic, Rev. Sci. Instrum., Sep. 1987, pp. 1589-,1592, vol. 58, No. 9, American Institute of Physics.

Okuji, S., et al., Spatial Distributions Of Ion-Species In A Large-Volume Inductively Coupled Plasma Source, Surface & Coatings Technology, 2001, pp. 102-105, vol. 136, Elsevier Science B.V.

Rosen, Johanna, et al., Charge State And Time Resolved Plasma Composition Of A Pulsed Zirconium Arc In A Nitrogen Environment, Journal Of Applied Physics, 2004, pp. 4793-4799, vol. 96, No. 9, American Institute of Physics.

Saito, Naoaki, et al., Development Of A Compact Time-Of-Flight Mass Spectrometer With A Length Of 1 m For Processing Plasma Diagnostics, Jpn. J. Appl. Phys., Aug. 2003, pp. 5306-5312, vol. 42, No. 8, The Japan Society of Applied Physics.

R.M. Jordon & Co., Inc., "TOF Fundamentals," pp. 1-18, downloaded on Mar. 10, 2006 from http:/www.rmjordan.com/Resources/Tutorial.pdf.

* cited by examiner

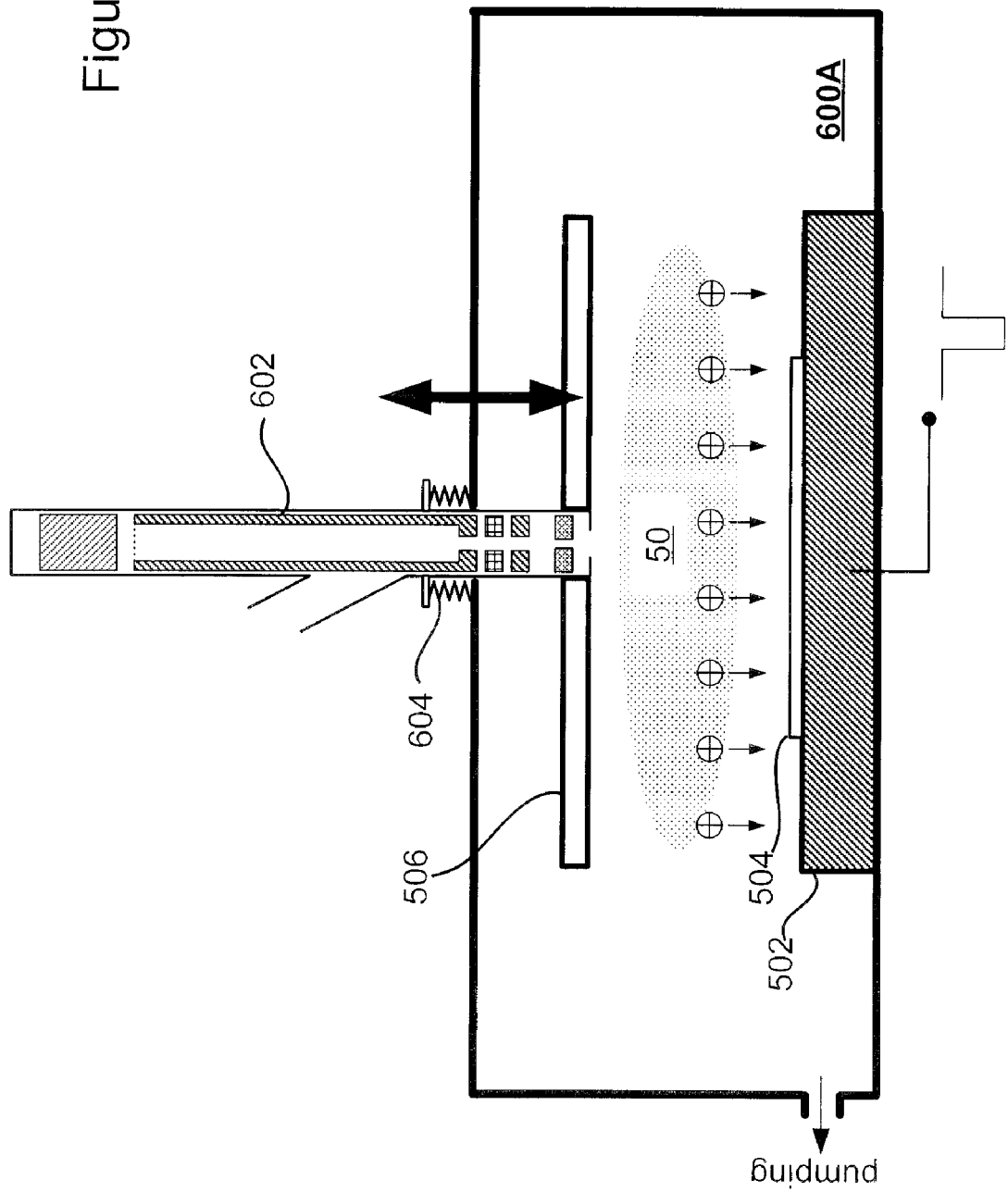

TECHNIQUE FOR MONITORING AND CONTROLLING A PLASMA PROCESS

RELATED APPLICATION SECTION

This patent application is a continuation-in-part of U.S. patent application Ser. No. 11/371,907, filed on Mar. 10, 2006, entitled "Technique for Monitoring and Controlling a Plasma Process." The entire disclosure of U.S. patent application Ser. No. 11/371,907 is incorporated herein by reference.

BACKGROUND OF THE INVENTION

Plasma processes are widely used in semiconductor manufacturing, for example, to implant wafers with various dopants, to deposit or to etch thin films. In order to achieve predictable and repeatable process results, it is critical to closely monitor and control the plasma characteristics. For example, studies of plasma doping (PLAD) processes have shown that ion composition of a plasma may be a critical piece of information that determines dopant species, dopant depth profiles, process-related contamination, etc. The ion composition changes with PLAD process parameters such as gas ratio, total gas pressure, and discharge power. The ion composition can also change significantly depending on the conditioning status of a plasma chamber. Therefore, it is important to know the ion composition during a PLAD process, preferably in situ and in real-time, in order to achieve repeatable and predictable process results.

Existing plasma tools often lack the capability of providing detailed real-time information (e.g., ion composition) of a plasma. In a typical PLAD process, for example, a plasma is controlled by monitoring an implant dose based on a Faraday cup current. However, a Faraday cup is just a total charge counter, which does not distinguish different charged particles or otherwise offer any insight of the plasma properties. Although in-situ mass analysis has been employed in some traditional beam-line ion implantation systems, it has typically been avoided in plasma-based ion implantation systems in order to achieve a high throughput.

In addition, conventional ion sensors, such as commercial mass/energy analyzers and quadrapole mass spectrometers, are often too bulky and/or too intrusive to implement in production tools. Large ion sensors tend to perturb a plasma under measurement and therefore distort the process results. Furthermore, the size and weight of conventional ion sensors often limit their deployment options in a semiconductor process tool. Furthermore, in pulsed plasma processing wherein a plasma alternates between on and off states, time-resolved measurements of the plasma are often required. However, few existing ion sensors provide the capability of time-resolved measurements.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 6a-c show different examples of plasma processing chambers in accordance with embodiments of the present disclosure.

DETAILED DESCRIPTION

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

Embodiments of the present disclosure provide a number of compact designs of time-of-flight (TOF) ion sensors that are suitable for in-situ monitoring and controlling of a plasma process. These designs may employ flexible ion extraction and ion focusing techniques to measure ion composition in a plasma chamber. Each TOF ion sensor may be installed in a variety of ways in the plasma chamber and may be configured for a number of functions such as, for example, in-situ process control, chamber readiness verification, fault detection, implant dose correction, and implant uniformity measurement. The sensitivity and size of each ion sensor may allow time-resolved measurement and spatial measurement of a plasma.

Figure 1:
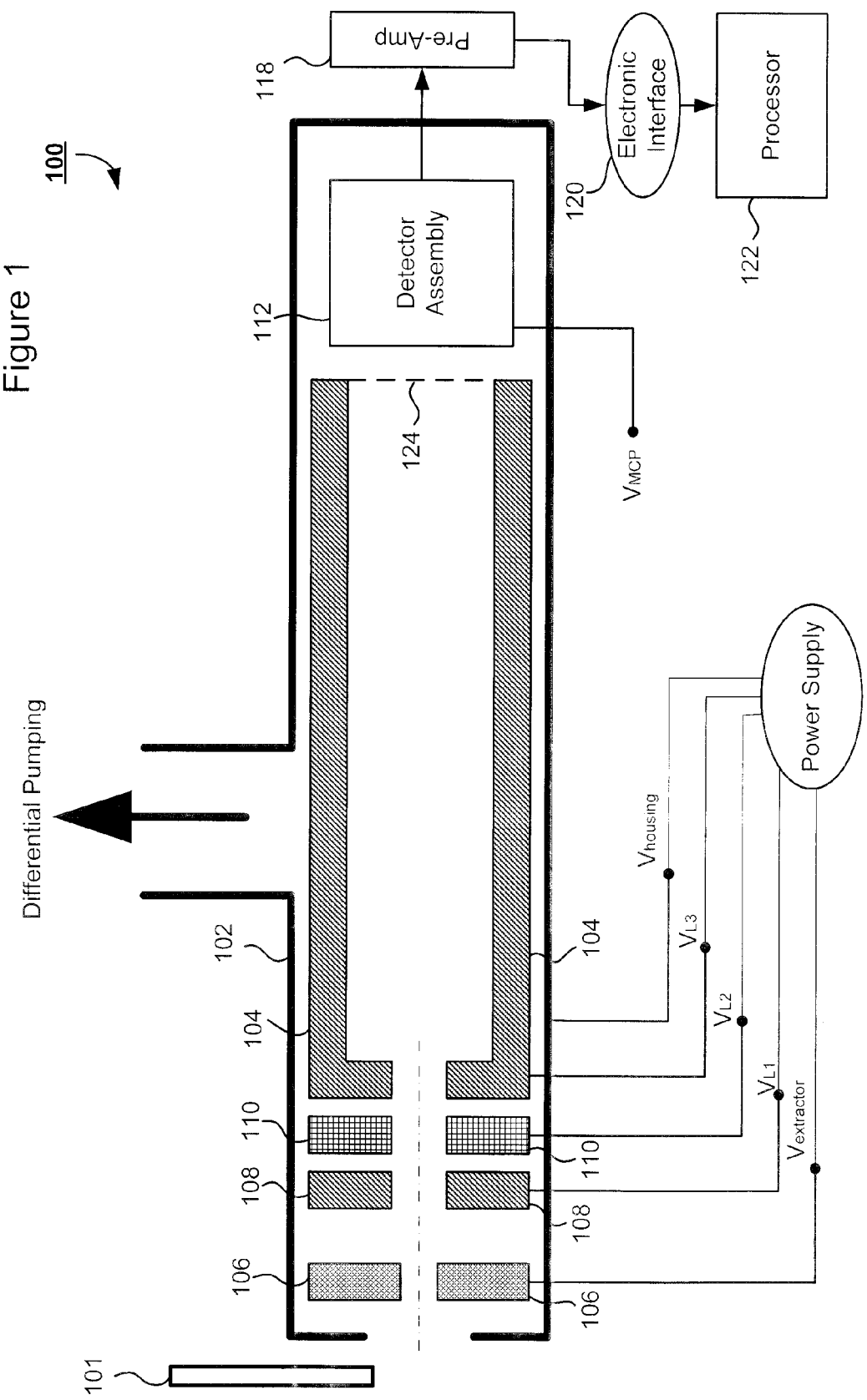
FIG. 1 shows an exemplary ion sensor in accordance with an embodiment of the present disclosure.

Referring to FIG. 1, there is shown an exemplary ion sensor 100 in accordance with an embodiment of the present disclosure. In some embodiments, the ion sensor 100 includes an ionization source 101 that generates ions proximate to the entrance of the ion sensor 100. In one embodiment, the ion source 101 generates an electron cloud using a low energy electron source. The electrons in the electron cloud cause electron impact that facilitates the ionization of neutral atoms and molecules and the conversion of ions by electron attachment. In various other embodiments, the ion source 101 generates ions proximate to the entrance of the ion sensor 100 by ion-impact and/or by photon-impact ionization. The ion source 101 can be a continuous or a pulsed ion source. The ion source 101 is useful for some applications where it is desirable to provide conventional RGA type measurements of the neutral gas or fast neutral species.

Ion sensor 100 comprises a housing 102 that may be adapted for installation in a view port of a plasma chamber and that may accommodate differential pumping. The housing 102 may be individually biased at a desired potential $V_{housing}$. A left hand side of the housing 102 may be referred to as an "extractor side" since ions extracted from a plasma enter the ion sensor 100 via an aperture ("housing aperture") on the left hand side of the housing 102. A right hand side of the housing 102 may be referred to as a "detector side" since ion detection takes place on the right hand side of the housing 102.

The ion sensor 100 includes a drift tube 104 inside the housing 102 which may also be individually biased, for example, at a desired potential $V_{L3}$. The drift tube 104 typically has a hollow space with a negligible electromagnetic field. An extractor side of the drift tube 104 may have an aperture ("drift tube aperture") for admitting ions. A detector side of the drift tube 104 may have a grid 124 that allows ions to exit while shielding out external electric fields. The plasma chamber's pressure is typically 1-3,000 mTorr, while the drift tube pressure is typically at $2\times10^{-6}$ Torr or less. Differential pumping can be used to maintain the pressure difference.

Various embodiments include one or more electrodes and/or grids that form lenses or deflectors proximate to the extractor side of the drift tube 104, between the housing aperture and the drift tube aperture. In some embodiments, there are a series of electrodes for extracting and focusing ions. For example, there may be an extractor electrode 106 proximate to the housing aperture. The extractor electrode 106 may have an aperture that is between 10 and 500 microns in diameter (preferable 50-200 microns for some embodiments), although the actual aperture size may vary, at least in part, on the differential pumping requirements. The extractor electrode 106 may be biased at a suitable potential $V_{extractor}$ in order to attract either positive or negative ions from a plasma. The attracted ions may be traveling at diverse angles.

To ensure that the attracted ions travel towards the detector side within a finite beam angle (e.g., equal or less than +/−1.5 degrees), two or more electrodes (e.g., electrostatic lenses 108 and 110) may be arranged in series with their apertures aligned with those of the housing 102, the extractor 106, and the drift tub 104. Each electrostatic lens may be individually biased to create a desired electrostatic field that directs the ions in a focused beam. In various modes of operation, the electrostatic lenses are biased with either a positive or a negative voltage. One of the electrostatic lenses may be provided with a voltage pulse to admit a portion (or packet) of the attracted ions into the drift tube 104. The voltage pulse may be repeated in a timed manner for a periodical or near-continuous sampling of the ions.

In various embodiments, a combination of a repeller voltage and an extraction voltage pulse is applied to any pair of electrodes to drives positive ions into the drift tube 104. The flight time of the ions is determined relative to the time at which the extraction pulse occurs. For example, in one embodiment, the electrostatic lens 108 is biased with a positive voltage pulse $V_{L1}$. The positive voltage pulse can be periodic or non-periodic. The electrostatic lens 110 is biased at a positive repelling voltage $V_{L2}$. In one embodiment, a positive repeller voltage is applied to electrostatic lens 110 and a positive voltage pulse is applied to the nearby electrostatic lens 108 in order to drive positive ions past the repeller electrodes and into the drift tube 104. The positive repeller voltage may be periodic or not. The drift tube 104, when biased at $V_{L3}$, may function as a third electrostatic lens in the series. The bias voltage on the drift tube may be a pulsed voltage. Negative ions may be extracted into the drift tube using a similar arrangement.

In some embodiments, voltage pulses are applied to more than one of the electrodes. For example voltage pulses can be applied to at least two of the drift tube 104, the extractor 106, the electrostatic lens 108, and the electrostatic lens 110. The at least two voltage pulses can be applied either simultaneously or delayed by a predetermined time in order to cause ions to enter the drift tube.

In some embodiments, a blocking voltage is applied to at least one of the extractor 106, the electrostatic lens 108, and the electrostatic lens 110 in order to effectively prevent ions from traveling into the drift tube 104. In some methods of operation, the magnitude of the blocking voltage is periodically varied in order to allow some ions to enter the drift tube. The flight time of the ions through the drift tube 104 is determined relative to the time at which this voltage is changed.

Once admitted into the drift tube 104, the ions drift towards the detector end virtually unaffected by any electric field. The ions typically have the same kinetic energy. Heavy ions travel relatively slow and light ions travel relatively fast. Given a sufficient flight time (i.e., sufficient length of the drift tube 104), the ions become separated into individual packets based on ion mass of their ionic species.

In some embodiments, the transmission of ions (positive or negative) through the drift tube is modulated using an arrangement of quadrupole elements. In one embodiment, the modulation is periodic. In another embodiment, the modulation is non-periodic. Modulation may be accomplished by varying the RF or DC voltages associated with the individual quadrupole elements. In these embodiments, the flight time of the ions is determined relative to the time at which the modulation occurs.

In various other embodiments, the transmission of ions (positive or negative) through the drift tube can be modulated by numerous other means. For example, the transmission of ions can be modulated by electrostatic deflection of the ions. The transmission of ions can also be modulated by a mechanical means such as a mechanical gating, multi-stage chopper, or any other type of mechanical interrupter. For example, in one embodiment, the mechanical interrupter is a mechanical shutter. Modulation by mechanical means is sometimes advantageous for low energy applications. In these embodiments, the flight time of the ions is also determined relative to the time at which the modulation occurs.

On the detector side, a detector assembly 112 may be used to detect the ions. The detector assembly 112 may be any type of commercially available or customized ion detection device (e.g., micro-channel plate (MCP) assembly). Detection and/or collection of the ions may be controlled, for example, with one or more voltage biases such as $V_{MCP}$. The detector assembly 112 may be coupled to a pre-amplifier 118 that is in turn coupled to a processor unit 122 via an electronic interface 120. The electronic interface 120 may be, for example, a fast data acquisition card. The processor unit 122 may be, for example, a personal computer (PC) or an industrial type of computing device.

The individual ion packets having distinct ion mass numbers are detected sequentially by the detector. The detected signals are amplified by the pre-amplifier 118. The amplified signals are then processed by the processor unit 122. Signals corresponding to each individual packet produce a mass peak in a mass spectrum. The mass spectrum accurately reflects an ion composition of the plasma based on one or more samplings of ion species from the plasma.

In some embodiments, the detector assembly 112 includes position-sensitive particle detectors that are used to detect the ions at certain predetermined positions. These position-sensitive particle detectors provide ion positional information that can be used to determine ion mass or ion energy. In various embodiments, the portion of the detector surface used to detect ions is selected by electrical, magnetic, or mechanical means. For example, an electrically addressable detector array can be used to detect ions as a function of position. A software algorithm can be used to extract the position-sensitive data from the detector signals. Also, mechanical means can be used to control the effective divergence of the ions impacting the detector. For example, a mechanical barrier can be used to shield a portion of the detector. In addition, ion deflectors or ion collimators can be used to deflect or to collimate the ions so that they only impact a desired portion of the detector.

Figure 3:
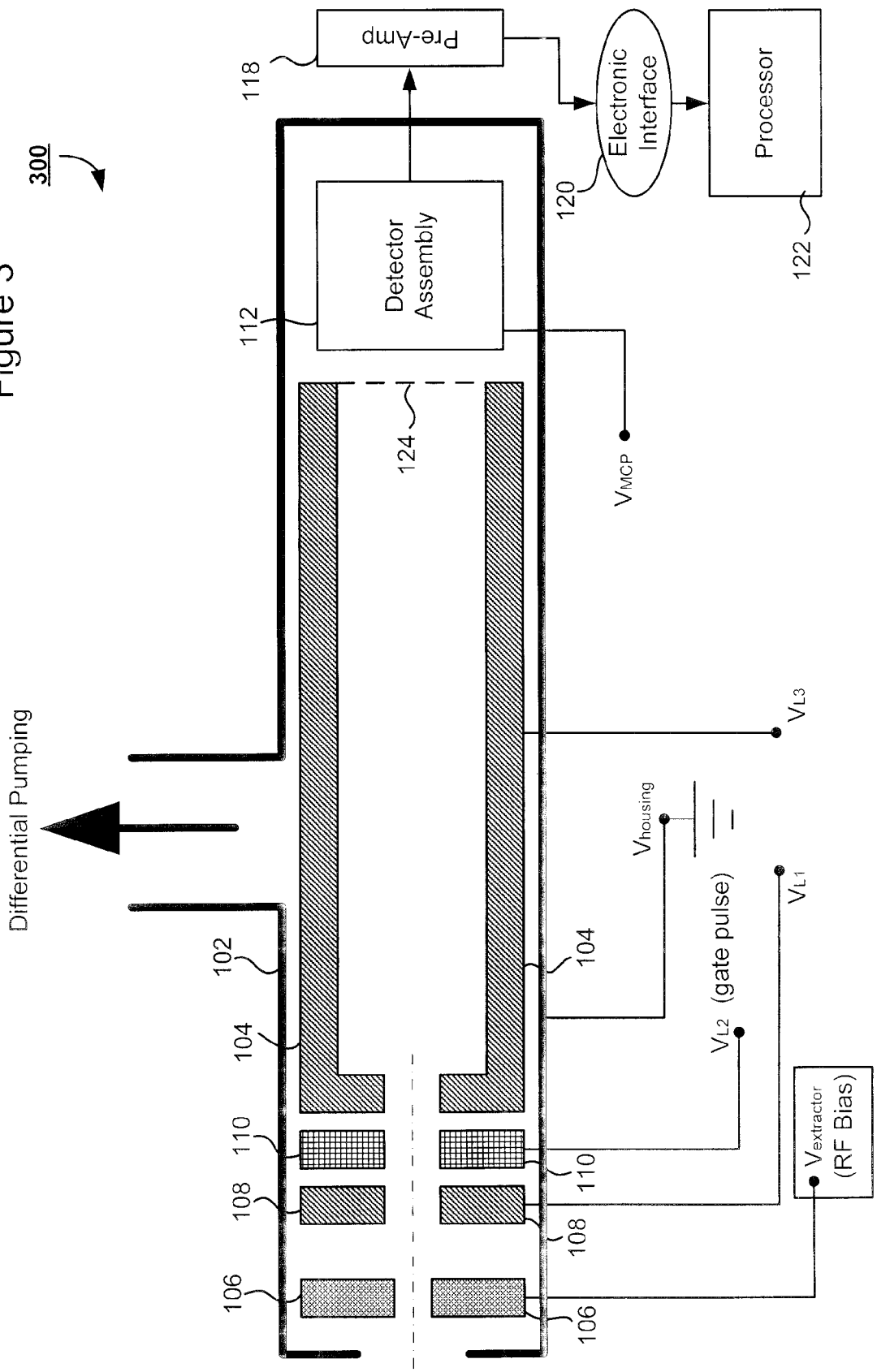
FIG. 3 shows an ion sensor having another exemplary configuration in accordance with an embodiment of the present disclosure.
Figure 4:
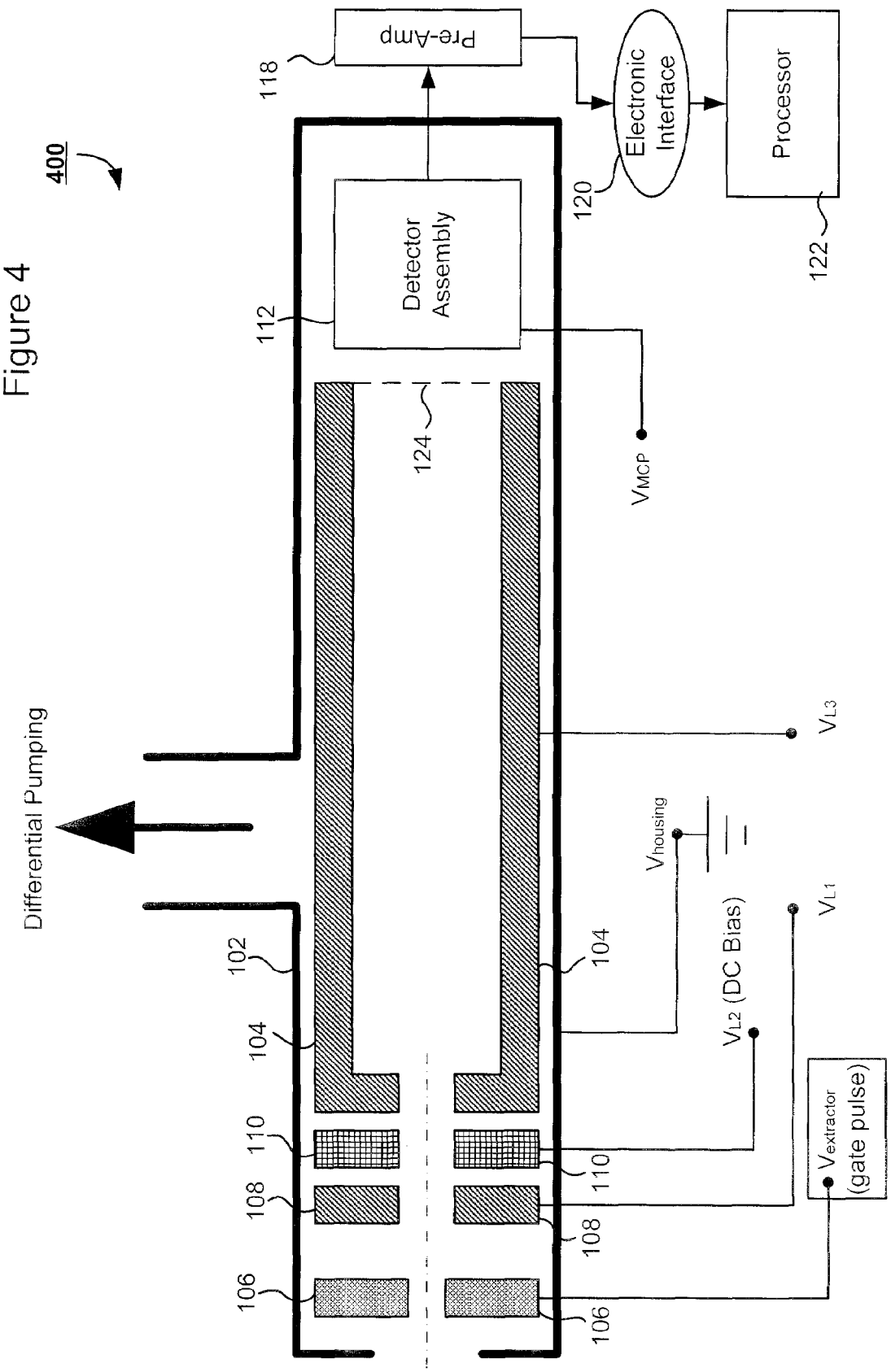
FIG. 4 shows an ion sensor having yet another exemplary configuration in accordance with an embodiment of the present disclosure.

According to embodiments of the present disclosure, the ion sensor 100 may be flexibly configured by applying different combinations of voltage potentials to the housing 102, the drift tube 104, the extractor electrode 106, the electrostatic lenses 108 and 110, and the detector assembly 112. Exemplary configurations are shown in FIGS. 2-4.

Figure 2:
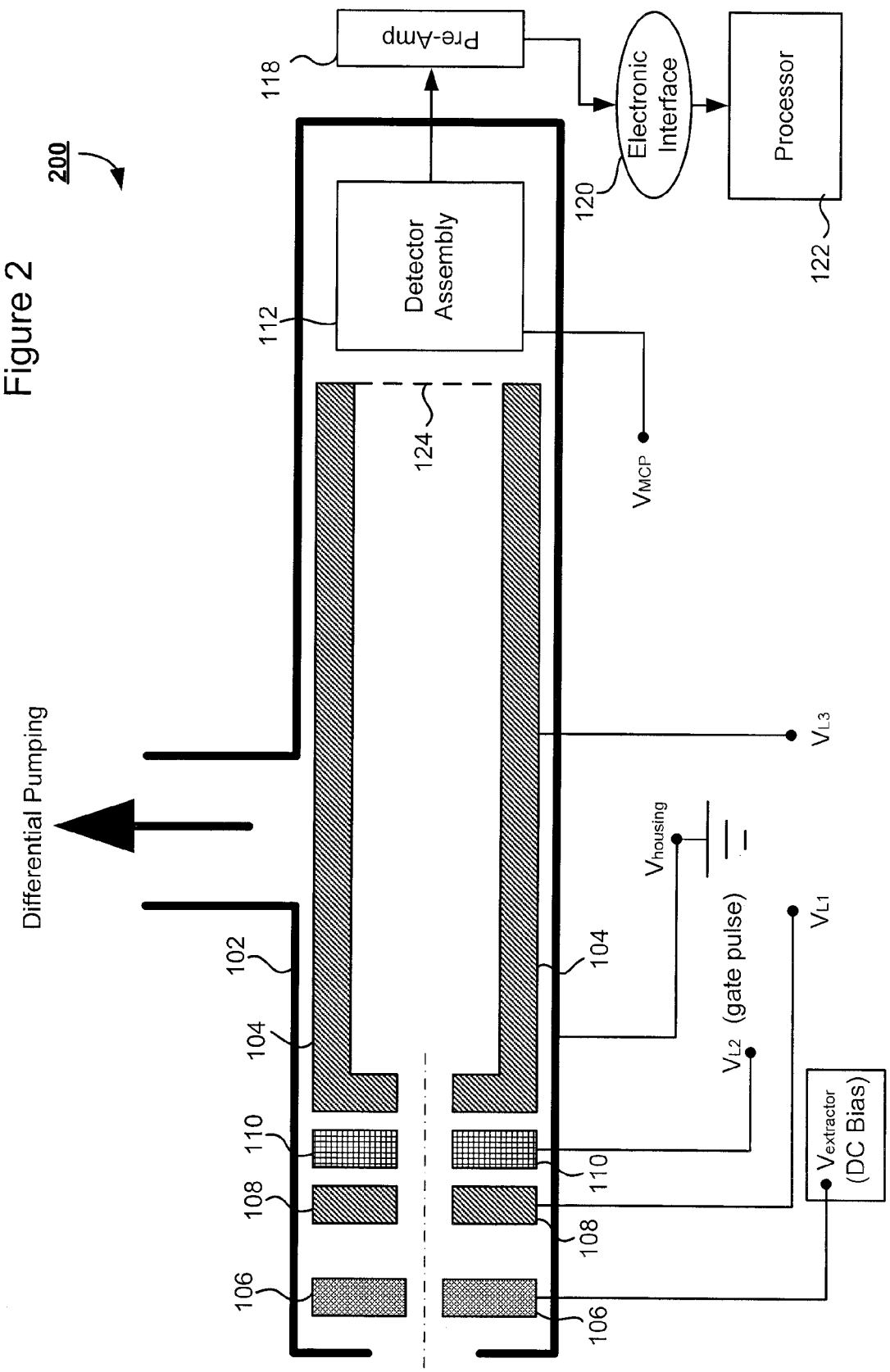
FIG. 2 shows an ion sensor having one exemplary configuration in accordance with an embodiment of the present disclosure.

FIG. 2 shows an ion sensor 200 having one exemplary configuration in accordance with an embodiment of the present disclosure. The ion sensor 200 may comprise substantially the same components as the ion sensor 100 shown in FIG. 1. In this exemplary configuration, the housing 104 may be grounded and/or attached to a plasma chamber wall.

In some embodiments, the extractor electrode 106 is biased at a DC extractor voltage $V_{extractor} \approx -50V-0V$ DC for extraction of positive ions or $V_{extractor} \approx 0V-50V$ DC for extraction of negative ions. In other embodiments, a pulsed voltage or RF signal is applied to the extractor electrode 106 to attract or repel ions. In another embodiment, the extractor electrode 106 is electrically floating. In various embodiments, the pulsed voltage is periodic or non-periodic and the RF signal is pulsed or CW. The pulsed and RF voltage signals may be used to enable desorption from or deposition on the electrode surface.

For illustration purposes, the description below will assume that only positive ions are sampled. It should be noted, however, that embodiments of the present disclosure can be easily adapted or configured for sampling of negative ions. Furthermore, for simplicity, the electrostatic lens 108 is referred to as Lens 1, the electrostatic lens 110 is referred to as Lens 2, and the drift tube 104 is referred to as Lens 3. Lens 1 and Lens 3 may be held at a same or similar potential which may be a fixed value between, for example, −150V and −300V. The desired potential is determined by factors, such as the length of the drift tube 104 and the desired ion mass resolution.

In some embodiments, Lens 1 and Lens 3 may be biased at different potentials (e.g., $V_{L1}=-400V--200V$ and $VL3=-200V$). Lens 2 may be biased at $V_{L2}32 -500V--900V$. Lens 2 may be further configured as a "gate" for the drift tube 104. To open the gate, a short voltage pulse (e.g., 50-500 nanosecond) may be provided to Lens 2 to admit a packet of ions into the drift tube 104. To close the gate, a relatively large positive potential may be imposed on Lens 2 to block positive ions from entering the drift tube 104. According to one embodiment, Lens 2 (i.e., gate electrode) may be normally biased with a positive voltage, e.g. +30V or above, except during the very short gating period. For example, assuming that the gate pulse width is 100 ns, and the wafer's pulse frequency is 5,000 kHz (period=200 microsecond) and that samples are performed once per wafer pulse, then during 99.95% of the period (199.9 microsecond) the gate electrode is closed and in only 0.05% of the period is the gate electrode open.

When the gate pulse is synchronized with the wafer pulse, a delay may be introduced to control where the gate pulse is open relative to the wafer pulse. In this way, it is possible to sample the plasma at different points in time space with a high resolution. The collective effect of the biases on Lenses 1-3 may be an electrostatic field that focuses the admitted ions into a beam with a limited divergence angle. On the detector side, the detector assembly 112 may be biased at a high voltage $V_{MCP}$. The grid 124 may electrostatically shield the drift tube 104 from the high voltage $V_{MCP}$.

The ion sensor 200 may also be configured for time-resolved measurements of a plasma. Many semiconductor processing plasmas are "pulsed plasmas" which alternate between on and off (afterglow) states periodically. The plasma-on state may last 1-50% (or higher) of each cycle. The pulsed operation can cause dynamic changes in plasma conditions and process chemistries. The sampling of the ion species may be synchronized with either the plasma pulses or wafer bias pulse, or both if they are synchronized. By changing the gate delay relative to the reference pulse (plasma pulses and/or wafer bias), time-resolved measurement could be carried out over the whole period.

The flight times of the ions are determined by observing the time difference between a start signal and a stop signal. The ion modulation event (an electrical or mechanical event) is initiated by the start signal. The stop signal is determined by the arrival time of the ions at the ion detector. In some embodiments, start and stop signals are used to gate a pulse train of known frequency to give a count that is proportional to the flight time. In one specific embodiment, the start and stop signals are used to generate a voltage across a capacitor, which is then discharged at a constant rate. The discharge period is used to gate a pulse train to give an count that is proportional to the flight time. In another embodiment, the start and stop signals are used to enable the generation of an analog pulse whose magnitude is proportional to the flight time.

The ion sensor 200 may also be configured to measure the energy distribution of the ions and/or the plasma potential. In one embodiment, an electrode or grid, such as the extractor electrode 106, the electrostatic lens 108, and the electrostatic lens 110 is biased to be a retarding element. The number of ions transmitted as a function of the electrode voltage is then measured. Both the energy distribution and the plasma potential can be determined from the measured data.

In another embodiment, the energy distribution of the ions is determined by observing the spread in the arrival times of the ions at the detector assembly 122. For example, position-sensitive particle detectors can be used to detect the ions at certain predetermined positions as described in connection with FIG. 1. Also, the energy distribution can be measured directly by methods that are well known in the art. For example, calibrated particle detectors can be used to measure energy or mass by observing the amplitude of signals generated by the detectors.

In yet other embodiments, the drift tube 104 is configured to perform the function of an energy analyzer. There are numerous ways to configure the drift tube 104 as an energy analyzer. For example, in one embodiment, the drift tube 104 is formed in a curved shape and includes electrostatic or magnetic deflection elements. The shape of the drift tube 104 is chosen so that ions with different energies bend with different angles. In another embodiment, the drift tube 104 includes a parallel-plate energy analyzer as part of the drift path to the detector assembly 112. For example, the energy analyzer can be a 45 degree type energy analyzer. In another embodiment, the drift tube 104 includes a cylindrical mirror or a spherical energy analyzer as part of the drift path to the detector assembly 112. In another embodiment, one or more grids are placed in the ion path to configure the drift tube 104 as a retarding potential analyzer. Also, in another embodiment, the drift tube can include a RF quadrupole or one or more permanent or electromagnets with the ability to differentiate between ions of different energies by adjusting the RF or DC voltages. The positions of the permanent magnets can be adjustable.

Figure 2A:
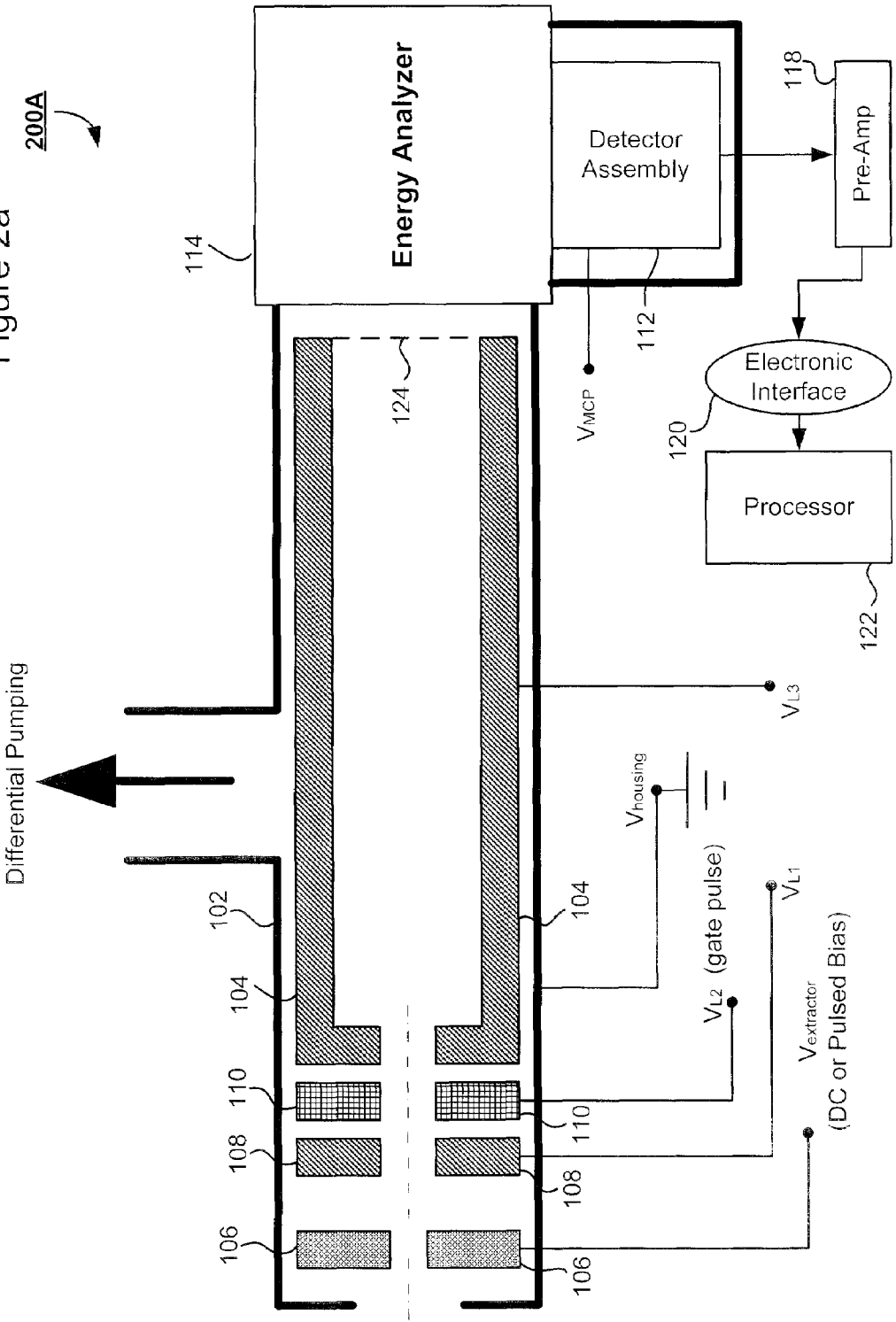
FIG. 2a shows an ion sensor having an energy analyzer in accordance with an embodiment of the present disclosure.

FIG. 2*a* shows an ion sensor 200A having an energy analyzer 114 in accordance with an embodiment of the present disclosure. The energy analyzer 114 is positioned between the drift tube 104 and the detector assembly 112. The energy analyzer 114 can be used to select ions within a desired energy range.

FIG. 3 shows an ion sensor 300 having another exemplary configuration in accordance with an embodiment of the present disclosure. The ion sensor 300 may comprise substantially the same components as the ion sensor 100 shown in FIG. 1. However, in this exemplary configuration, the extractor electrode 106 receives a RF (1-300 MHz, typically 13.56 MHz) bias. The RF biased extractor electrode 106 may serve dual functions. That is, the extractor electrode 106 may extract ions and also may remove deposits from the extractor aperture in a deposition-dominant environment.

Many semiconductor manufacturing processes are carried out in a deposition-dominant environment wherein thin-film materials are deposited in a plasma chamber. If a thick insulating film blocks the extractor aperture, a DC bias on the extractor electrode 106 may no longer be effective. A RF bias may help sputter clean the extractor aperture to remove the deposited materials. Thus, a RF bias may provide the ion sensor 300 with a "self-cleaning" capability. For ion extraction, the RF bias may have a negative average potential (or RF self-bias) between −50V and 0V, and a peak-to-peak value of 0V-100V. For sputter cleaning purposes, the RF self-bias may be larger than a sputtering threshold and the peak-to-peak value may be 100-1000V or higher.

FIG. 4 shows an ion sensor 400 having yet another exemplary configuration in accordance with an embodiment of the present disclosure. The ion sensor 400 may comprise substantially the same components as the ion sensor 100 shown in FIG. 1. However, in this exemplary configuration the extractor electrode 106 also functions as a gate. A gate pulse may be provided to the extractor electrode 106 to pull a packet of ions into the ion sensor 400. Lens 2 may be provided with a DC bias to focus the ion beam.

Ion sensors in accordance with embodiments of the present disclosure may be installed in a number of ways for flexible detection of ion species in a plasma chamber. Exemplary installation options are shown in FIGS. 5-7.

Figure 5:
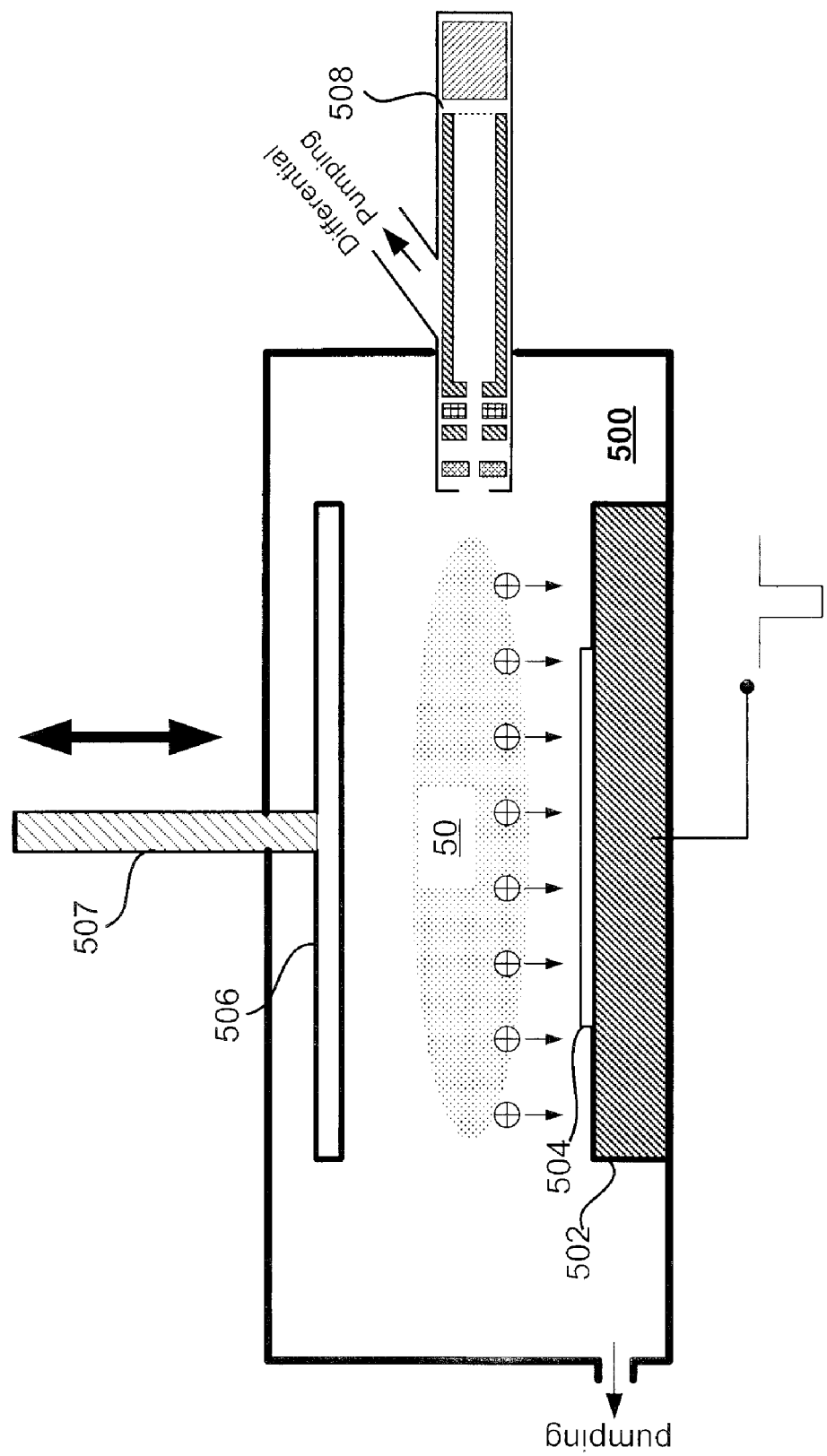
FIG. 5 shows one installation option for an ion sensor in accordance with an embodiment of the present disclosure.

FIG. 5 shows one installation option for an ion sensor 508 in accordance with an embodiment of the present disclosure. An over-simplified plasma chamber 500 is shown with a platen/cathode 502 holding a wafer 504. An anode 506 is positioned above the platen/cathode 502. The anode 506 is not necessarily grounded but may be biased at a voltage, for example, that is between −1 kV and +1 kV (other voltages are possible). An anode shaft 507 may enable movement of the anode 506 in the vertical direction. A plasma 50 may be generated between the anode 506 and the platen/cathode 502, either by cathode bias voltages or by additional plasma sources.

For ion implantation applications, negative voltage pulses may be applied to the platen 502 to draw positive ions towards the wafer 504. For negative ions, positive voltage pulses may be used. The ion sensor 508 may be installed in a sidewall of the plasma chamber 500. The installation may be through a view port or similar mechanism. The ion sensor 508 may have its extractor tip extended sideway into or near an edge of the plasma 50. The extractor tip may be positioned on a movable mount. Due to the small size of the extractor tip, it may be inserted deep into the plasma 50 without significantly disturbing the plasma 50.

Figure 6:
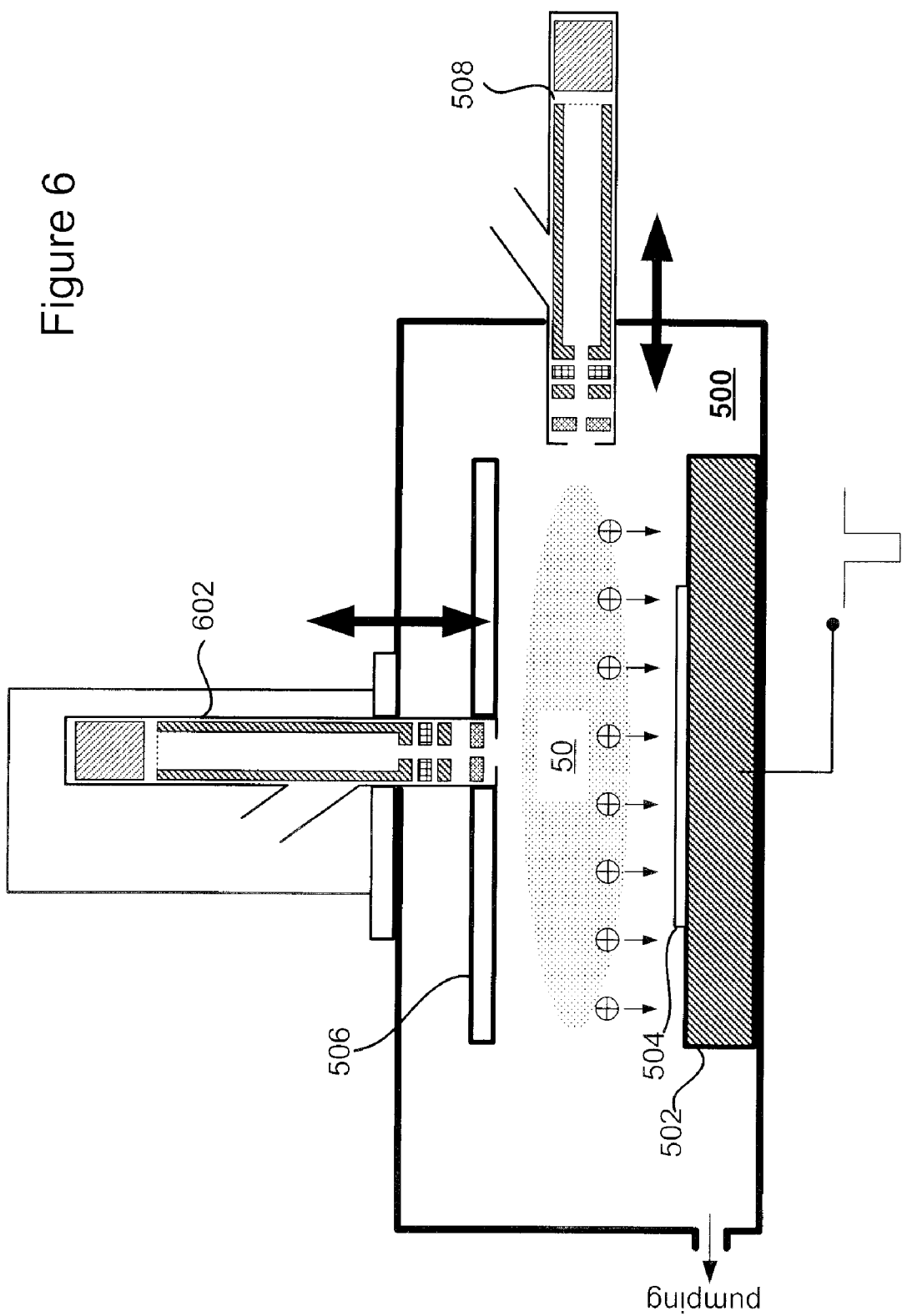
FIG. 6 shows another installation option for an ion sensor in accordance with an embodiment of the present disclosure.
Figure 7:
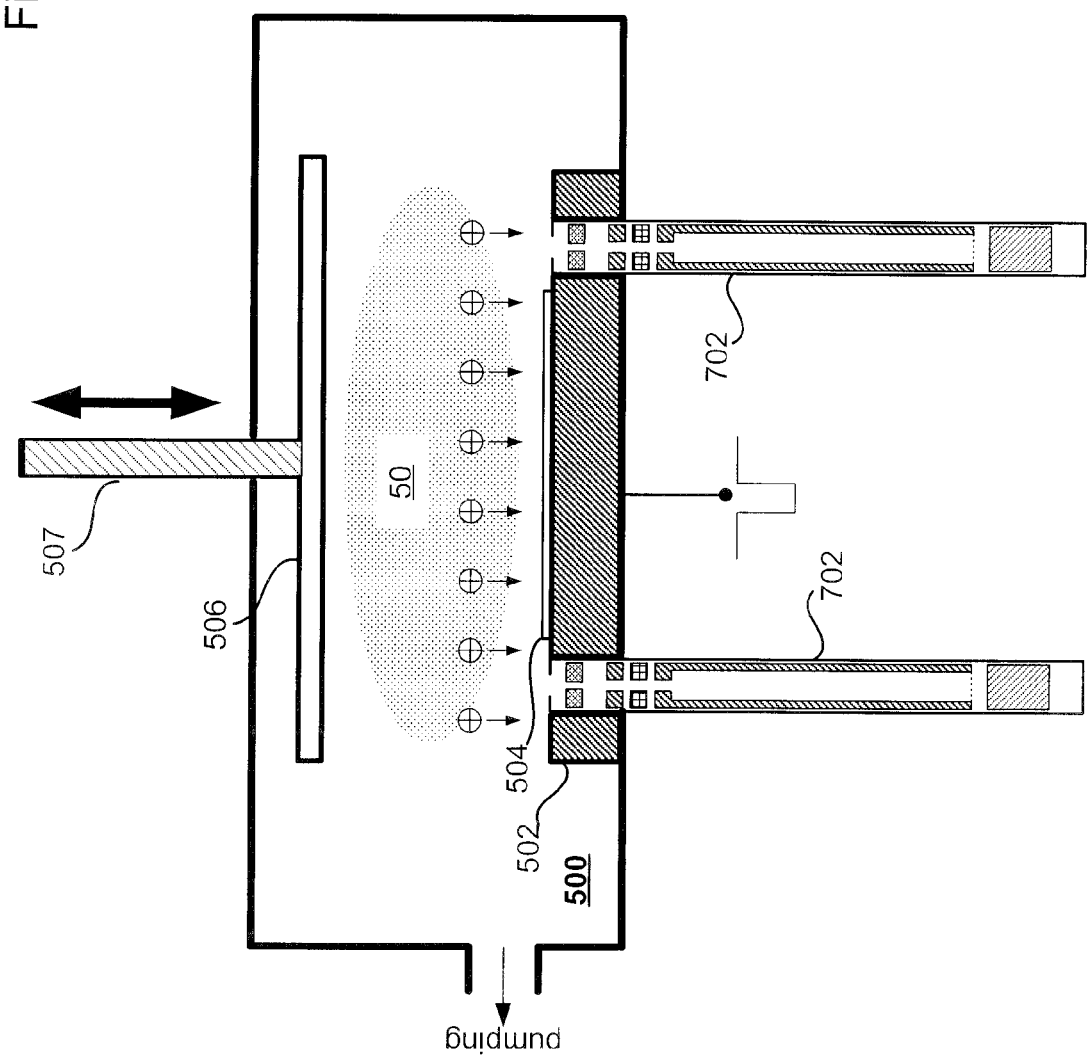
FIG. 7 shows yet another installation option for an ion sensor in accordance with an embodiment of the present disclosure.

FIG. 6 shows another installation option for an ion sensor in accordance with an embodiment of the present disclosure. In this installation option, instead of or in addition to the ion sensor 508 installed in the sidewall, an ion sensor 602 may be installed on the anode side. That is, the ion sensor 602 may be positioned through the anode 506 and may be vertically oriented with its extractor tip pointing downwards at or into the plasma 50. The ion sensor 602 may be electrically connected with the anode 506. The ion sensor 602 or its extractor tip may move up and down independent from the anode 506 to sample ions at different spatial points in the plasma chamber 500. Alternatively, the ion sensor 602 or its extractor tip may move up and down together with the anode 506 for in-situ diagnostic of different process conditions. The horizontally positioned ion sensor 508 may be similarly actuated for a spatial measurement of the plasma 50.

Figure 6B:
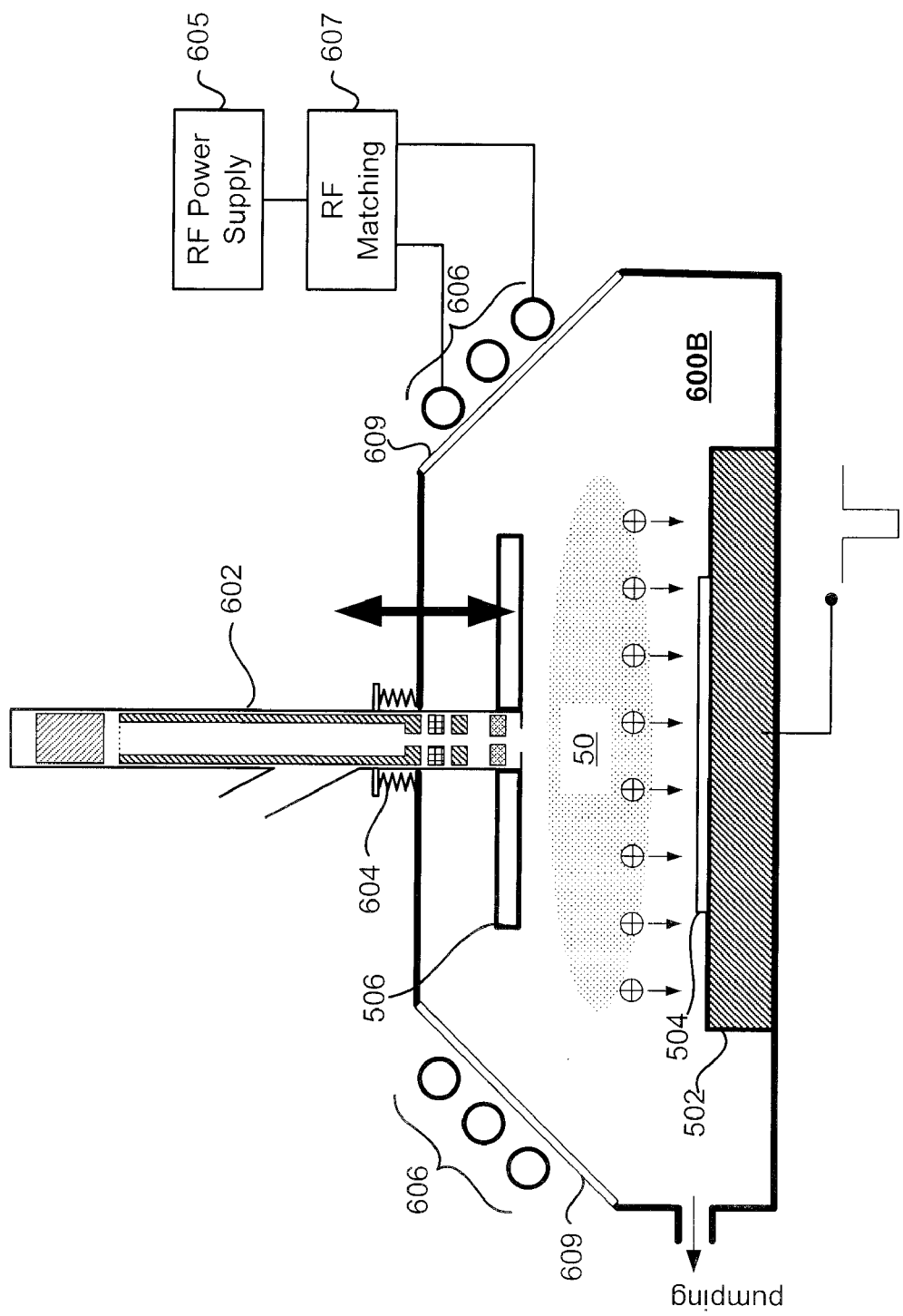
Figure 6C:
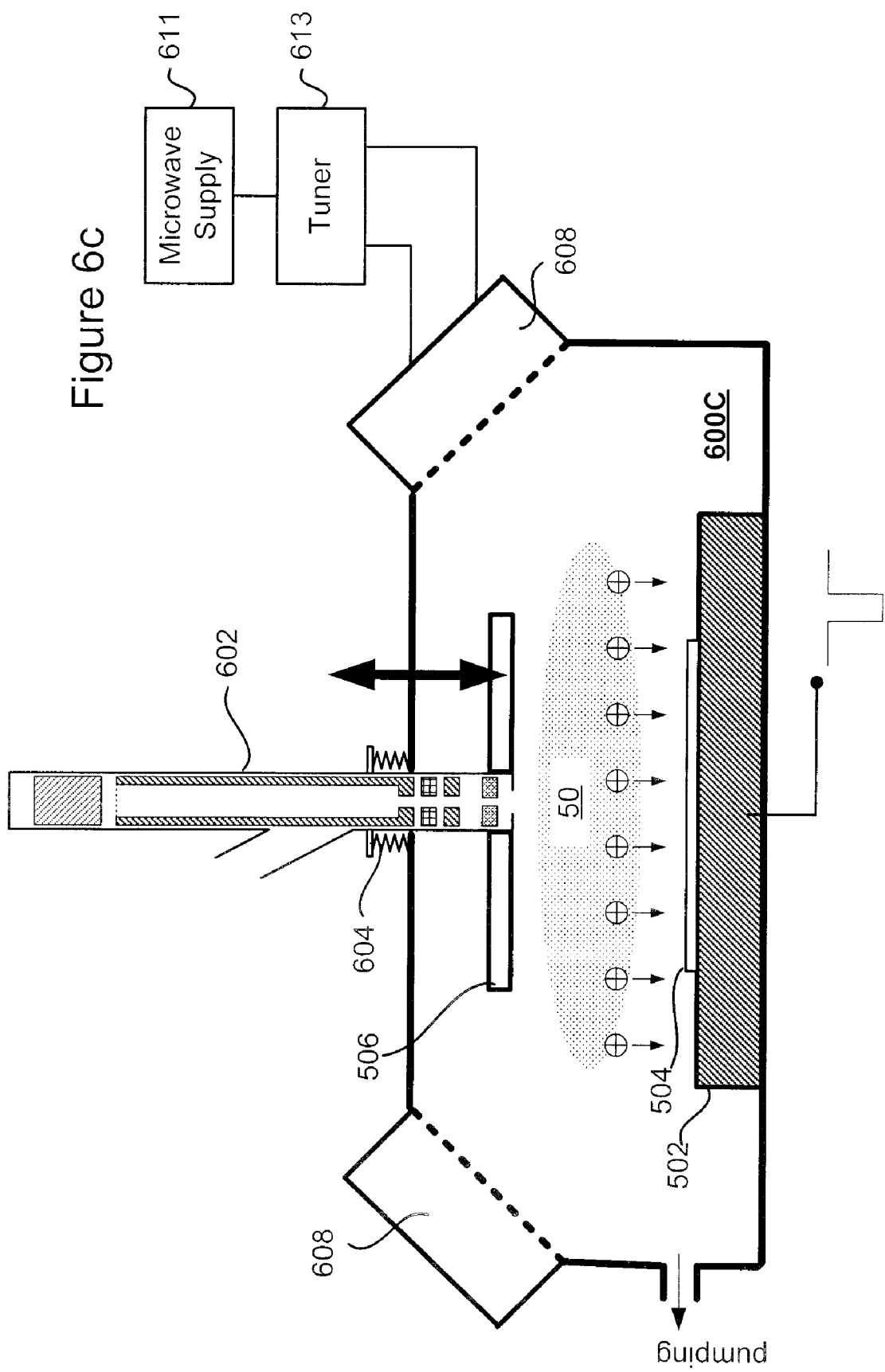

FIGS. 6*a-c* show different examples of plasma processing chambers in accordance with embodiments of the present disclosure.

In FIG. 6*a*, there is shown a plasma chamber 600A. An ion sensor 602 may be installed through an anode 506. A bellows seal 604 may accommodate installation and movement of the ion sensor 602 through the chamber wall. The plasma 50 may be generated by negatively pulsed voltages applied on the wafer 504 or the platen 502. According to one embodiment, extraction of ions from the plasma 50 into the ion sensor 602 may be synchronized with the plasma generation, and therefore the voltage pulses on the wafer 504.

In FIG. 6*b*, there is shown a plasma chamber 600B. The plasma generation technique shown in FIG. 6*b* is different from the plasma generation technique shown in FIG. 6*a*. The plasma chamber 600B may have one or more external plasma sources, such as, for example, ICP or Helicon plasma sources. For example, in one embodiment, a RF power supply 605 and a RF matching unit 607 is coupled to RF coils 606. Through dielectric interfaces 609, the RF coils 606 may supply RF electrical power into the plasma chamber 600B. The platen 502 may be biased to control the energy of ions that impact the wafer 504.

In FIG. 6*c*, there is shown a plasma chamber 600C, wherein another plasma generation technique is employed. One or more microwave sources may be coupled to the plasma chamber 600C to supply the power to generate and sustain the plasma 50. For example, a microwave supply 611 may be coupled to a microwave cavity 608 via a tuner 613 and a waveguide or cable. The microwave power supplied to the microwave cavity 608 may generate a "source plasma" therein, whereupon the source plasma may diffuse into the plasma chamber 600C to produce the plasma 50. Alternatively, the plasma 50 may be generated directly inside the plasma chamber 600C by coupling microwave power via the cavity 608 and into the plasma chamber 600C.

FIG. 7 shows yet another installation option for an ion sensor in accordance with an embodiment of the present disclosure. In this installation option, one or more ion sensors 702 may be installed on the cathode side. That is, an ion sensor 702 may be positioned vertically through the platen/cathode 502 with the extractor tip positioned next to the wafer 504. The installation location for the ion sensor 702 may be (or near) where a Faraday cup would be typically located. Since the extractor tip is pointing up at the plasma 50, the ion sensor 702 and the wafer 504 may share a same or similar vantage point with respect to the plasma 50. As a result, the ion sensor 702 may "see" the same composition and dose of ions as what the wafer 504 sees, which may facilitate a more accurate control of plasma processing of the wafer 504. In a plasma doping (PLAD) system, for example, the ion sensor 702 may be able to directly detect what ions are implanted into the wafer 504. If desired, the ion sensor 702 may also be moved up and down for a spatial measurement.

Figure 7A:
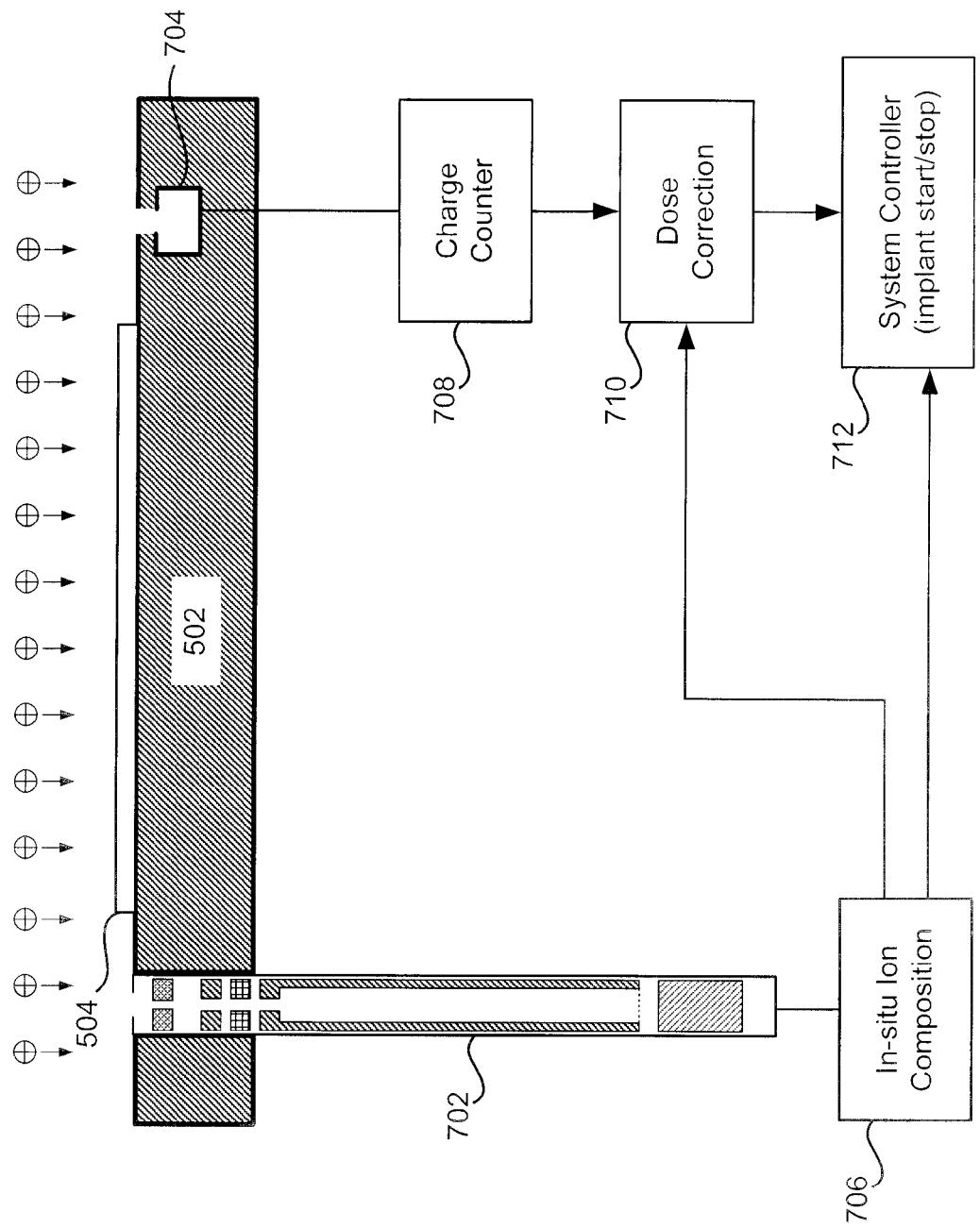
FIGS. 7a-b show exemplary systems for employing ion sensors for process control in accordance with embodiments of the present disclosure.
Figure 7B:
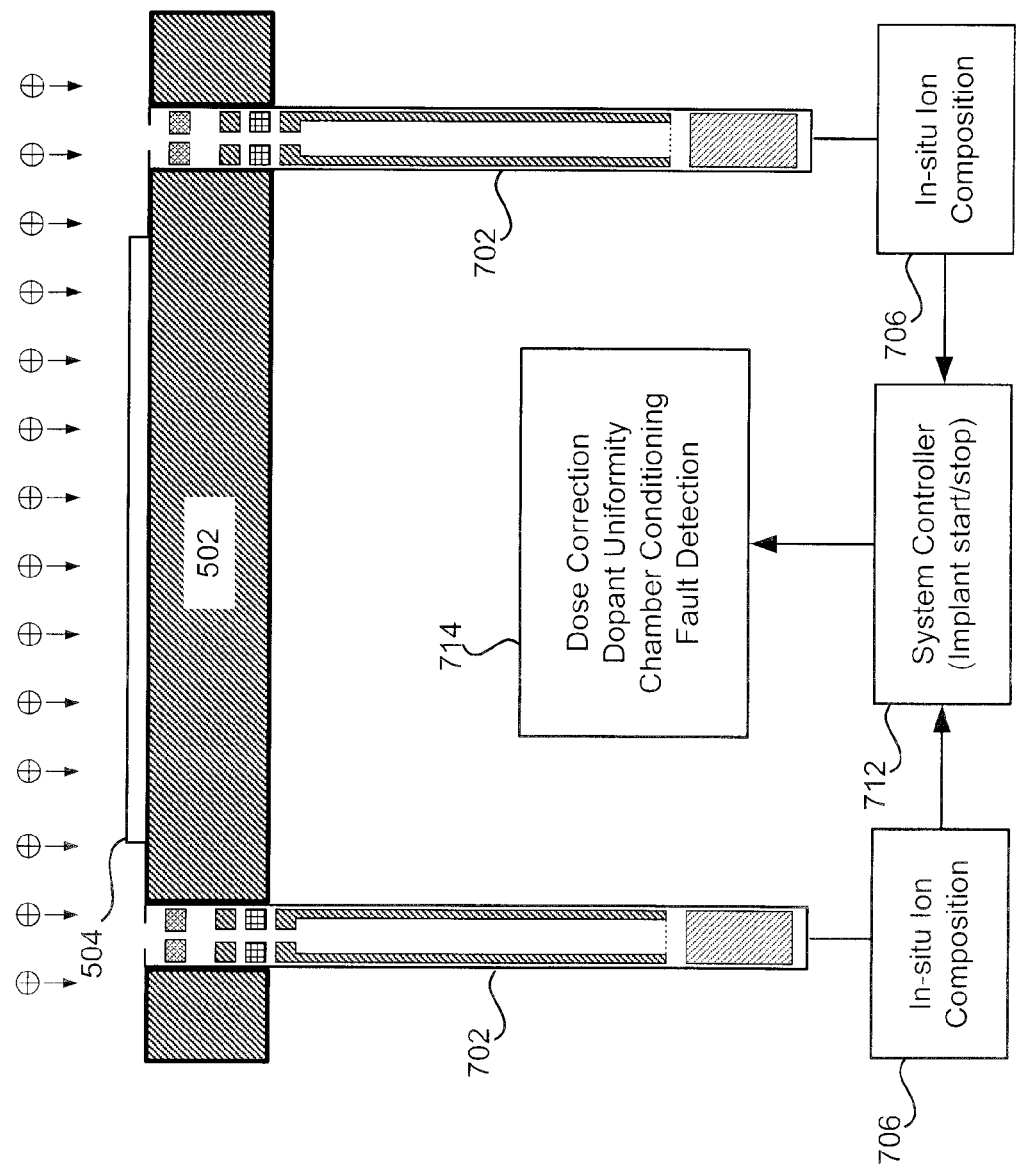

FIGS. 7a-b show exemplary systems for employing ion sensors for process control in accordance with embodiments of the present disclosure.

FIG. 7a shows an ion sensor 702 being installed next to the wafer 504. A Faraday cup 704 may be installed on the other side of the wafer 504 or the Faraday cup 704 may partially surround the wafer 504. Both the ion sensor 702 and the Faraday cup 704 face up to a plasma (not shown) as the wafer 504. The ion sensor 702 may be coupled to a unit 706 that calculates an in-situ ion composition based on detection data received from the ion sensor 702. The Faraday cup 704 may be coupled to a charge counter 708 that calculates a total ion dose based on the Faraday cup current. The ion composition information and the ion dose data may be input to a dose correction module 710. In addition, the ion composition data may be input to a system controller 712 for further process control.

FIG. 7b shows two or more ion sensors 702 being installed around the wafer 504. The in-situ ion composition data from these ion sensors 702 may be input to the system controller 712. Output functions 714 of the system controller 712 may include, but are not limited to, ion dose correction, dose uniformity control, plasma chamber conditioning, and/or process fault detection. In embodiments where the sensor is installed in a platen around the wafer 504, the drift tube 104 (FIG. 1) may either be isolated from the platen or be at the platen potential.

For the cathode-side (or wafer-side) measurement of the plasma 50, the ion sensor 702 may be configured differently from those shown in FIGS. 2-4. One example is shown in FIG. 8.

Figure 8:
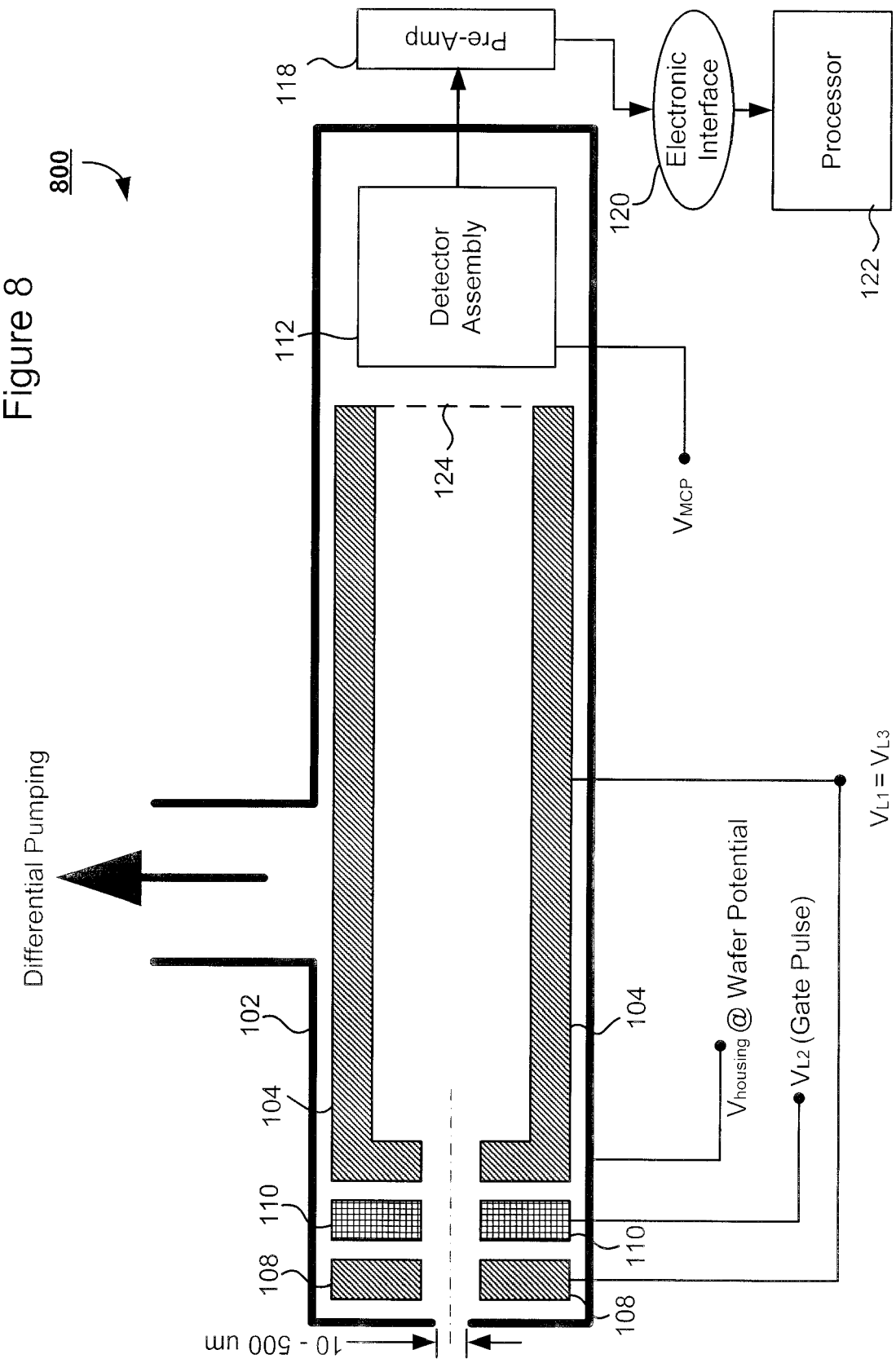
FIG. 8 shows an exemplary ion sensor in accordance with an embodiment of the present disclosure.

FIG. 8 shows an exemplary ion sensor 800 in accordance with an embodiment of the present disclosure. The ion sensor 800 may comprise substantially the same components as the ion sensor 200 shown in FIG. 2, except that the extractor electrode 106 is removed. The housing aperture at the extractor side may be shrunk to approximately 10-500 microns (preferably 50-200 microns). The housing 102 may be biased at a same or similar potential (e.g., 0V--10 kV) as the wafer 504. Lens 1, Lens 3 (drift tube 104), and detector assembly 112 may also be biased at a same or similar potential. Lens 2 may function as a gate to pulse ion packets into the drift tube 104.

At this point it should be noted that the ion sensors in accordance with the present disclosure as described above typically involves the processing of input data and the generation of output data to some extent. In various embodiments, this input data processing and output data generation may be implemented in hardware or software. For example, specific electronic components may be employed in a plasma processing tool or similar or related circuitry for implementing the functions associated with in-situ monitoring of ion species in accordance with the present disclosure as described above. Alternatively, one or more processors operating in accordance with stored instructions may implement the functions associated with in-situ monitoring of ion species in accordance with the present disclosure as described above. If such is the case, it is within the scope of the present disclosure that such instructions may be stored on one or more processor readable carriers (e.g., a magnetic disk), or transmitted to one or more processors via one or more signals.

In one embodiment, the dose or plasma conditions may be changed as part of an automated or semi-automated closed control loop that includes a controller or computer and electronic instrumentation that is responsive to data obtained from TOF sensor according to the present invention. The Data obtained from the detector assembly 112 can include the absolute or relative magnitudes of various portions of the measured TOF spectra. The data from the detector assembly 112 can also include the shape of the time-of-flight peaks, such as changes in FWHM. The data from the detector assembly 112 can also include the presence or absence of minor (contaminant) peaks, the energy distribution, and the mass distribution.

The data from the TOF sensor can be used to detect fault conditions, such as gas impurities, residual contaminants, and malfunctions of equipment used to control the plasma. The plasma conditions can be changed in response to the data by adjusting the TOF sensor's operating parameters, such as gas flow, gas mixture, pressure, RF power, RF frequency, implant voltage, duty cycle, or other plasma related parameter.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A time-of-flight ion sensor for monitoring ion species in a plasma used for processing a substrate, the time-of-flight ion sensor comprising:
    a housing;
    a drift tube that is positioned in the housing the drift tube being configured as an energy analyzer;
    an extractor electrode positioned in the housing at a first end of the drift tube, the extractor electrode being configured to perform at least one of attraction and repulsion of ions from a plasma;
    a plurality of electrodes that are positioned at a first end of the drift tube proximate to the extractor electrode, the plurality of electrodes being biased so as to cause at least a portion of the attracted ions to enter the drift tube and to drift towards a second end of the drift tube; and
    an ion detector that is positioned proximate to the second end of the drift tube, the ion detector detecting arrival times associated with the at least a portion of the attracted ions.

2. The ion sensor according to claim 1, wherein the extractor electrode is electrically floating or biased at a potential that performs at least one of attraction and repulsion of ions from a plasma.

3. The ion sensor according to claim 1, wherein at least one of the plurality of electrodes comprises an electrostatic lens that focuses the ions.

4. The ion sensor according to claim 1, wherein at least one of the plurality of electrodes comprises a grid that deflects the ions.

5. The ion sensor according to claim 1, further comprising a DC power supply having an output that is electrically connected to the extractor electrode, the DC power supply generating a DC voltage on the extractor electrode that performs at least one of attraction and repulsion of ions in the plasma.

6. The ion sensor according to claim 1, further comprising a pulsed power supply having an output that is electrically connected to the extractor electrode, the pulsed power supply generating a pulsed voltage signal on the extractor electrode that performs at least one of attraction and repulsion of ions in the plasma.

7. The ion sensor according to claim 6, wherein the pulsed voltage signal comprises a periodic signal.

8. The ion sensor according to claim 1, further comprising a pulsed power supply having an output that is electrically connected to one of the plurality of electrodes, the pulsed power supply generating a voltage pulse signal that performs one of attraction and repulsion of ions.

9. The ion sensor according to claim 8, wherein the voltage pulse signal causes one of desorption from and deposition on the one of the plurality of electrodes.

10. The ion sensor according to claim 8, wherein the voltage pulse signal is synchronized with a voltage applied to a wafer being processed by the plasma.

11. The ion sensor according to claim 8, wherein the voltage pulse signal is delayed with respect to a timing reference signal in order to achieve a time-resolved measurement of the ions.

12. The ion sensor according to claim 8, wherein at least some voltage pulses in the voltage pulse signal have a width that is chosen to select particular ion masses.

13. The ion sensor according to claim 1, further comprising a RF power supply having an output that is electrically connected to one of the plurality of electrodes, the RF power supply generating a RF signal.

14. The ion sensor according to claim 13, wherein the RF signal causes one of desorption from and deposition on the one of the plurality of electrodes.

15. The ion sensor according to claim 13, wherein the RF power supply comprises a pulsed RF power supply.

16. The ion sensor according to claim 13, wherein the RF power supply comprises a CW RF power supply.

17. The ion sensor according to claim 1, further comprising a power supply having an output that is electrically connected to the drift tube.

18. The ion sensor according to claim 1, further comprising an ionization source that is positioned proximate to the extractor electrode, the ionization source generating ions proximate to the extractor electrode.

19. The ion sensor according to claim 1, wherein the ion sensor is installed through a sidewall of a plasma chamber with the extractor electrode positioned proximate to an edge of the plasma.

20. The ion sensor according to claim 1, further comprising a processor that receives data from the ion detector and that generates at least one of a control signal and a fault detection signal.

21. A method for monitoring ion species in a plasma used for processing a substrate, the method comprising:
    applying a bias voltage to an extractor electrode, the bias voltage performing at least one of attraction and repulsion of ions from the plasma;
    applying a voltage signal to at least one of a plurality of electrostatic electrodes that are positioned proximate to the extractor electrode, the voltage signal causing at least a portion of the attracted ions to drift though a drift tube;
    applying a blocking voltage to at least one electrode of the extractor electrode and the electrostatic electrodes at a pre determined time in order to prevent ions from traveling into the drift tube during the pre determined time;
    detecting arrival times at an end of the drift tube, the arrival times being associated with the at least a portion of attracted ions; and
    determining information about the plasma from the arrival times.

22. The method of claim 21 wherein the voltage signal comprises a pulsed voltage signal.

23. The method of claim 21 wherein the voltage signal comprises a RF voltage signal.

24. The method of claim 21 further comprising generating ions proximate to the extractor electrode.

25. The method of claim 21 further comprising applying a bias voltage to the drift tube.

26. The method of claim 25 wherein the bias voltage applied to the drift tube is pulsed.

27. The method of claim 21 further comprising modulating a transmission of ions through the drift tube.

28. The method of claim 27 wherein the modulation is periodic.

29. The method of claim 21 wherein the voltage signal to at least one of the plurality of electrodes is selected to cause desorption from the at least one of the plurality of electrodes.

30. The method of claim 21 wherein the voltage signal to at least one of the plurality of electrodes is selected to cause deposition on the at least one of the plurality of electrodes.

31. A time-of-flight ion sensor for monitoring ion species in a plasma used for processing a substrate comprising:
    a means for applying a bias voltage to an extractor electrode, the bias voltage performing at least one of attraction and repulsion of ions from the plasma;
    a means for applying a voltage signal to at least one of a plurality of electrodes that are positioned proximate to the extractor electrode, the voltage signal causing at least a portion of the attracted ions to drift though a drift tube that is configured as an energy analyzer; and
    a means for detecting arrival times at an end of the drift tube, wherein the arrival times are associated with the at least a portion of attracted ions.

* * * * *